US006994835B2

(12) United States Patent
Sasatani et al.

(10) Patent No.: US 6,994,835 B2
(45) Date of Patent: Feb. 7, 2006

(54) SILICON CONTINUOUS CASTING METHOD

(75) Inventors: Kenichi Sasatani, Ibaraki (JP);
Naritoshi Kimura, Amagasaki (JP);
Masakazu Ohnishi, Nishinomiya (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 312 days.

(21) Appl. No.: 10/220,148

(22) PCT Filed: Dec. 28, 2000

(86) PCT No.: PCT/JP00/09377

§ 371 (c)(1),
(2), (4) Date: Jan. 8, 2003

(87) PCT Pub. No.: WO02/053496

PCT Pub. Date: Jul. 11, 2002

(65) Prior Publication Data

US 2003/0150374 A1    Aug. 14, 2003

(51) Int. Cl.
*C01B 33/02* (2006.01)
(52) U.S. Cl. ............ 423/348; 164/503; 164/513; 164/338.1; 117/81
(58) Field of Classification Search ................ 423/348, 423/349, 350; 204/164; 164/508, 513, 338.1; 117/81
See application file for complete search history.

(56) References Cited

U.S. PATENT DOCUMENTS

| 5,182,091 | A | * | 1/1993 | Yuge et al. | 423/348 |
| 5,510,095 | A | * | 4/1996 | Aratani et al. | 423/348 |
| 6,090,361 | A | * | 7/2000 | Baba et al. | 423/350 |
| 6,231,826 | B1 | * | 5/2001 | Hanazawa et al. | 423/348 |

FOREIGN PATENT DOCUMENTS

JP          04338108 A   * 11/1992

* cited by examiner

*Primary Examiner*—Ngoc-Yen Nguyen
(74) *Attorney, Agent, or Firm*—Morrison & Foerster LLP

(57) ABSTRACT

The present invention reduces temperature gradient in the direction of the radius of solidified ingots of silicon immediately after solidification, which has serious influences on the quality as a solar cell and improves the quality. Silicon raw materials are melted inside a bottomless crucible combined with an induction coil by electromagnetic induction heating. The silicon melt formed inside the bottomless crucible is allowed to descend and solidified ingots of silicon are manufactured continuously. Plasma heating by a transferred plasma arc torch is also used for melting the silicon raw materials. The plasma arc torch is moved for scanning along the inner surface of the bottomless crucible in the horizontal direction. A plasma electrode on the solidified ingot side to generate transferred plasma arc is allowed to contact the surface of the solidified ingot at positions where the temperature of the solidified ingot becomes 500 to 900° C.

20 Claims, 15 Drawing Sheets

F I G 1
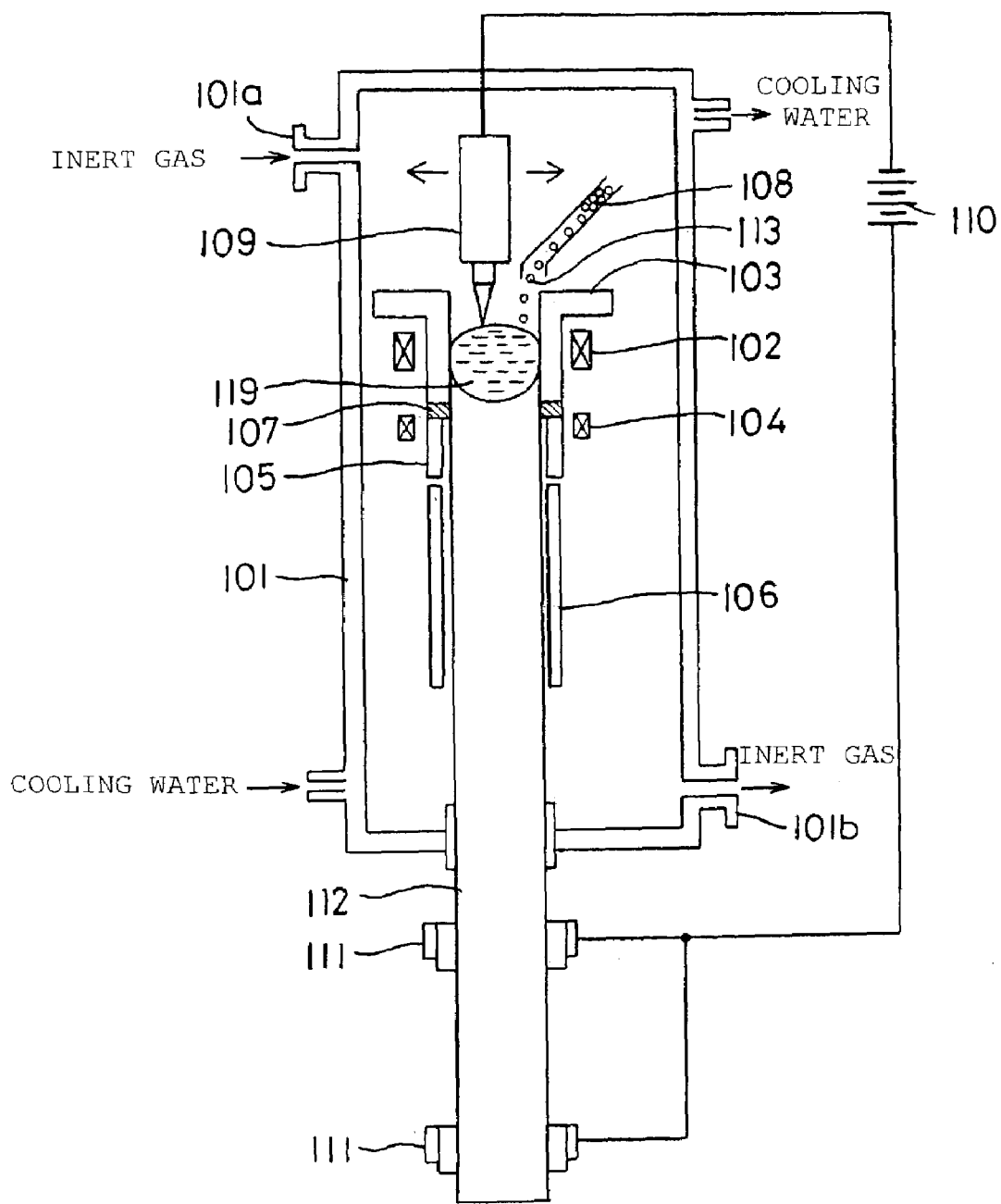

FIG 7
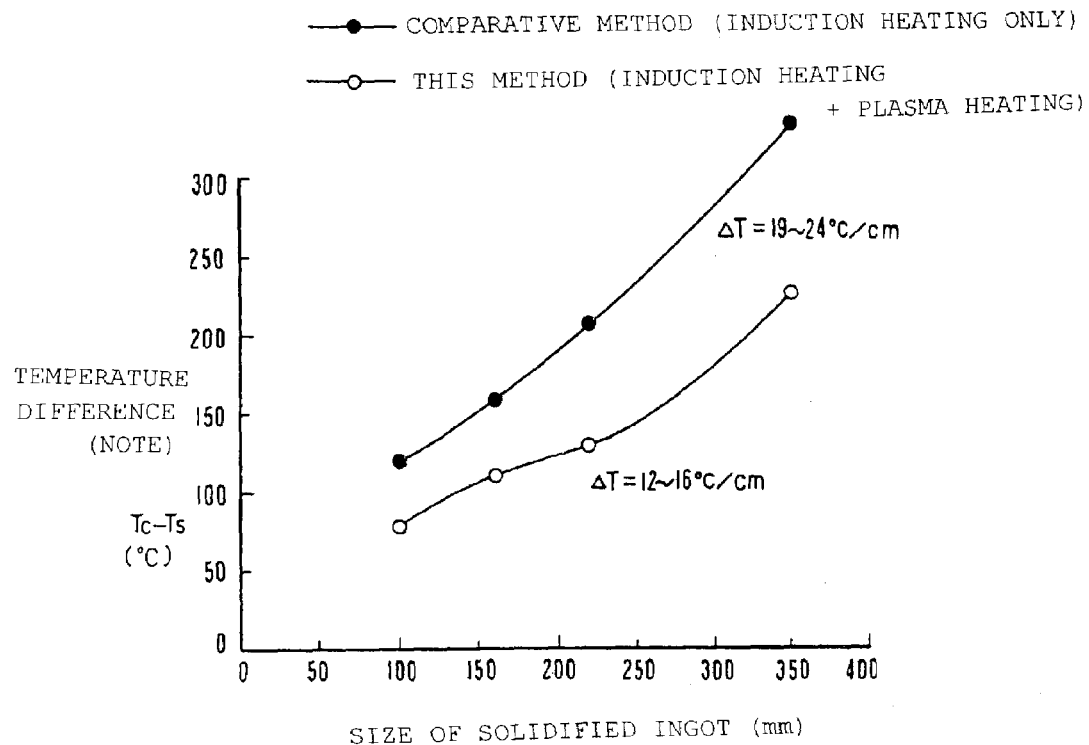
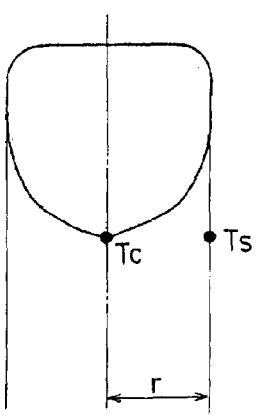
TEMPERATURE GRADIENT
IN R-AXIS DIRECTION
$\Delta T = (T_c - T_s)/r$ F I G 1 3
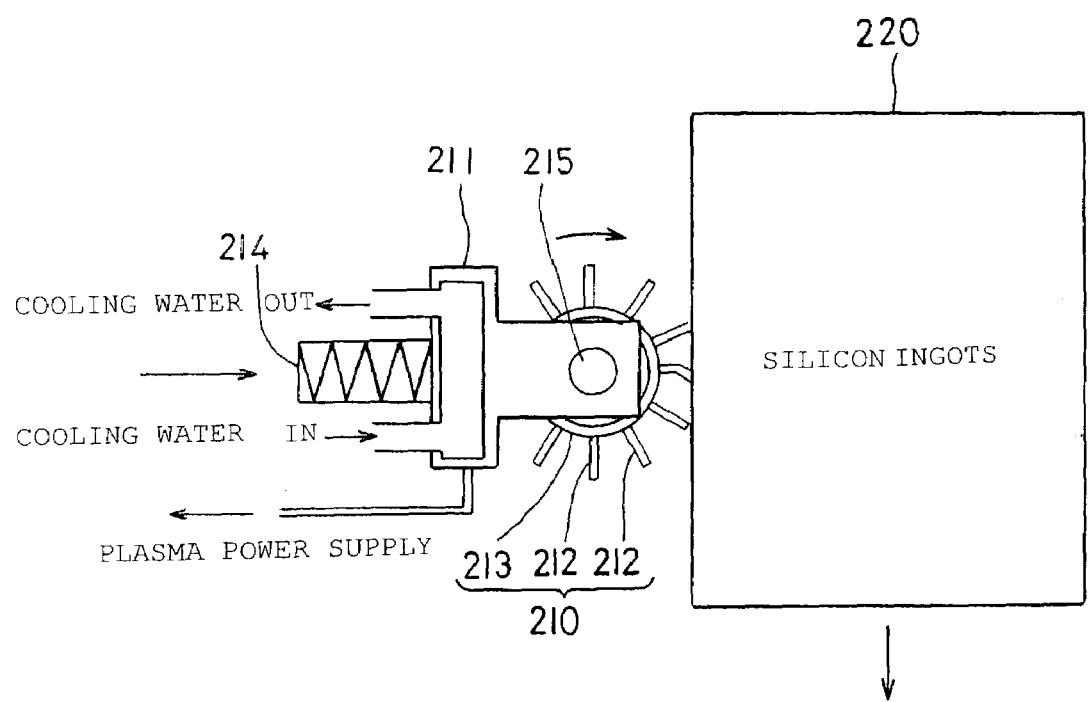

SILICON CONTINUOUS CASTING METHOD

TECHNICAL FIELD

The present invention relates to a silicon continuous casting method used for manufacturing ingots of silicon for a solar cell, etc.

BACKGROUND ART

A silicon wafer for a solar cell is conventionally manufactured by thinly slicing unidirectionally solidified ingots of silicon. The quality and cost of a silicon wafer are dependent on the quality and cost of solidified ingots of silicon. Thus, improving the quality of a silicon wafer and reducing the cost thereof will require that high quality unidirectionally solidified ingots of silicon should be manufactured at a low cost, and as this method, the applicant of the present invention has put a silicon continuous casting method using electromagnetic induction heating to practical use.

The silicon continuous casting method using electromagnetic induction heating uses an electrically conductive bottomless crucible 3 which is placed inside an induction coil 2 and at least part in the axial direction of which is divided in the circumferential direction as shown in FIG. 15. In a production run, silicon raw materials supplied into the bottomless crucible 3 are melted by induction heating with high frequency power supplied to the induction coil via the bottomless crucible 3, and while silicon melt 19 is solidified, it is extracted down below the bottomless crucible 3 and supply of raw materials into the bottomless crucible 3 is continued. In this way, unidirectionally solidified ingots of silicon 12 (hereinafter simply referred to as "solidified ingots of silicon") are manufactured continuously.

By dividing at least part in the axial direction of the bottomless crucible 3 in the circumferential direction, this method not only allows the silicon raw materials in the bottomless crucible 3 to be melted by electromagnetic induction heating but also allows the silicon melt 19 originated from the melting to generate a repulsive force against the bottomless crucible 3, thus reducing contact between the two, which makes it easier to extract the solidified ingots of silicon 12 and reduces pollution of the solidified ingots of silicon 12 by the bottomless crucible 3.

From the standpoint of the product quality, such a silicon continuous casting method is required to supply silicon raw materials of high quality with minimal impurities into the bottomless crucible. However, high quality silicon raw materials are expensive, and therefore silicon raw materials of low quality with relatively high percentage of impurities are required from the standpoint of the manufacturing cost. As the method of solving this contradiction, a method of refining silicon in a casting process by blowing a plasma gas onto the surface of the silicon melt in the bottomless crucible is disclosed in Japanese Patent Laid-Open No. 4-130009.

This method combines melting by electromagnetic induction heating and refining using a plasma gas, but a refining method using a plasma gas without using electromagnetic induction heating is also disclosed in Japanese Patent Laid-Open No. 11-49510, etc.

The plasma in the silicon continuous casting method combining melting by electromagnetic induction heating and refining using a plasma gas has not only the refining function but also the function as an effective heating source for melting silicon raw materials in the bottomless crucible. For continuous casting by electromagnetic induction heating, a secondary heating source is required to perform initial melting, etc. of silicon raw materials in the bottomless crucible. An electron beam, for example, is used as this secondary heating source, but heating by an electron beam requires decompression in a chamber, whereas plasma heating allows an operation at normal atmospheric pressure. Taking note of this advantage of plasma heating, the applicant of the present invention is proceeding with the development an electromagnetic induction casting method using plasma, transferred plasma arc in particular, as a secondary heating source as well.

On the other hand, in order to improve the performance of solidified ingots of silicon as a solar cell, it is effective to perform control in such a way as to minimize temperature gradient during the manufacture of solidified ingots of silicon in a temperature range from 1420° C., which is the melting point of silicon, to 1100° C. In connection therewith, the applicant of the present invention presented a "Method of manufacturing polycrystalline solidified ingots of silicon for a solar cell characterized by controlling temperature gradient to a range of 15 to 25° C./cm when silicon passes through temperature range of 1420° C. to 1200° C. in manufacturing polycrystalline solidified ingots of silicon to be supplied to solar cell through unidirectional solidification" in Japanese Patent Laid-Open No. 4-342496.

The reason why a reduction of temperature gradient in the temperature range from 1420° C. to 1100° C. is effective for improving the performance of a solar cell is that many crystalline defects occur when silicon passes through the temperature range from 1420° C. to 1100° C., which deteriorates the conversion efficiency of the solar cell and reducing the temperature gradient in this temperature range will reduce thermal stress generated inside crystals and prevent crystalline defects, etc.

Japanese Patent Laid-Open No. 4-342496 controls this temperature gradient and the temperature gradient here refers to temperature gradient in the axial direction of solidified ingots of silicon. According to the subsequent studies by the applicants of the present invention, what actually determines thermal stress is temperature gradient in the direction of the radius of solidified ingots of silicon and it has been discovered that it is necessary to reduce the temperature difference between the central area of an ingot and the surface of the ingot as close as to 0 in a high temperature area for the purpose of improving the performance.

In order to reduce temperature gradient in the direction of the radius of solidified ingots of silicon immediately after solidification according to the silicon continuous casting method using a bottomless crucible, it is necessary to reduce the amount of heat radiation from the side of ingots immediately after solidification. For this purpose, it is effective to keep warm the side of the solidified ingot immediately after solidification inside the bottomless crucible, and more specifically, it is effective to reduce the length from the lower end of the coil to the lower end of the crucible which constitutes the cooling section of the bottomless crucible. However, enhancing thermal insulation in such a way will increase the temperature of the surface of the ingot in the lower part of the bottomless crucible and when a certain temperature is exceeded, leakage of melt may occur due to breakage of the solidified shell. For this reason, if the amount of heat supplied from above the ingot is determined, a minimum amount of heat radiation available from the side is automatically determined within the range in which leakage of melt is prevented.

In case of the continuous casting method using electromagnetic induction heating, the silicon melt starts to solidify from the lower end level of the induction coil. The amount of heat necessary to melt the silicon raw materials to be supplied is only supplied by induction heating, and therefore convection of the silicon melt by an electromagnetic force is more conspicuous than when other heating methods are used, and as a result, the downward heat flow rate increases and a solid-liquid interface takes a concave shape deeply recessed downward. When the casting speed is further increased, the amount of induction heating increases and therefore convection becomes more conspicuous and the downward heat flow rate increases, which causes the concave shape of the solid-liquid interface to grow noticeably. As a result, the temperature in the central area does not reduce for a long time and the temperature gradient in the direction of the radius of the solidified ingot immediately after solidification increases.

In addition, when the concave shape of the solid-liquid interface grows noticeably, the solidified shell becomes thinner and it is more difficult to keep warm the side of the solidified ingot immediately after solidification and to increase the amount of heat radiation from the side, the length from the lower end of the induction coil to the lower end of the crucible which constitutes the cooling section of the bottomless crucible is increased. As a result, heat loss of the ingot which faces the surface of the crucible over a wide range immediately after solidification is promoted, causing considerable deterioration of quality.

In addition, in case of electromagnetic induction heating, an induction current flows near the surface of the silicon melt facing the inner surface of the crucible, and therefore most of Joule heat is generated near this surface. For this reason, the additional raw materials supplied into the silicon melt move close to the surface of the melt and start to melt there and the unmelted raw materials remain in the central area of the melt in the form of an island. Furthermore, because of electromagnetic force that acts on the melted silicon, the upper surface thereof upheaves and separates from the induction coil. This prevents an increase in the melting output from effectively contributing to an increase of the melting capacity. Thus, solubility of additional raw materials cannot be said to be sufficient.

On the other hand, as mentioned above, the applicant of the present invention is proceeding with the development of the electromagnetic induction casting method using plasma, transferred plasma arc in particular, concurrently as the secondary heating source. In the process of this research and development, it has been discovered that the concurrent use of transferred plasma arc is very effective in solving the above-described various problems accompanying electromagnetic induction heating.

That is, concurrent use of plasma heating for melting of raw materials in the middle of casting can reduce the load of electromagnetic induction heating and the reduction of load suppresses heat convection of melted silicon by electromagnetic force, suppresses the downward heat flow rate, flattens the solid-liquid interface and relaxes the concave shape. As a result, temperature gradient in the direction of the radius of the solidified ingots of silicon immediately after solidification is reduced. Furthermore, the solidified shell becomes thicker, which allows heat insulation of the side of the solidified ingot immediately after solidification to be enhanced and this heat insulation enhancement will also reduce temperature gradient in the direction of the radius.

Especially, in case of transferred plasma arc, it is easy to obtain large output necessary for casting silicon, and on top of it, an arc current flows through the solidified ingot of silicon which is the opposite electrode, and the Joule heat thereby generated is expected to have the effect of keeping warm the solidified ingots of silicon immediately after solidification from the inside thereof. Moreover, prevention of deterioration of solubility of the additional raw materials which presents a problem for electromagnetic induction heating can also be expected.

However, in case of conventional plasma heating used concurrently with continuous casting of silicon, heating is always performed on the central area of silicon melt in the bottomless crucible. To maximize the effects of plasma heating, it is effective to reduce electromagnetic force to the extent to which extraction of solidified ingots of silicon is not hampered and increase the load of plasma heating accordingly. In that case, it has been discovered that fixed heating of the central area of the silicon melt causes heat to be concentrated on the central area, making the concave shape of the solid-liquid interface grow noticeably and preventing sufficient improvement of the performance.

Furthermore, when continuous casting of silicon is performed by using transferred plasma heating concurrently with electromagnetic induction heating, it has also been discovered that the following problems occur in connection with the current-carrying path of the plasma current.

When silicon raw materials to be supplied into the bottomless crucible are heated and melted using transferred plasma arc, a plasma arc torch is inserted from above into the bottomless crucible to generate plasma arc between the torch and the silicon melt in the bottomless crucible. To generate this plasma arc, it is necessary to connect the torch to one electrode of a plasma power supply and electrically connect the other electrode to the solidified ingot of silicon extracted down below the bottomless crucible to supply power.

With regard to the power supply structure on the ingot side, Japanese Patent Laid-Open No. 11-49510 describes a case where a plasma electrode on the ingot side is attached to an extractor connected to the lower part of the solidified ingot of silicon. However, the solidified ingot of silicon extracted from the bottomless crucible itself becomes a resistance between the top end at which the solidified ingot of silicon contacts the silicon melt and the power supply section at which it contacts the plasma electrode, generating Joule heat caused by the plasma current. The specific resistance of silicon for a solar cell is on the order of 0.5 Ωcm to 2.0 Ωcm at normal temperature and this specific resistance increases as the temperature rises from normal temperature and reaches a maximum near 200° C. However, if the temperature further increases, the specific resistance decreases contrarily and reduces by triple-digits near the melting point (1410° C.) compared with normal temperature.

Attaching the plasma electrode on the ingot side to the extractor causes the solidified ingot of silicon to generate heat over the total length, but the total length of the ingot is not stable in case of continuous casting resulting in unstable heat generation. This causes seriously adverse influences on the quality of the ingot.

In the case where the total length of the solidified ingot of silicon increases as the casting proceeds, the current-carrying distance from the top end of the solidified ingot to the power supply section increases and electric resistance also increases, and therefore it is necessary to increase the output (voltage) of the plasma power supply considerably to give sufficient heat of melting to the silicon melt on the solidified ingot. This voltage increase deteriorates the thermal efficiency during casting and causes quite a big problem in manufacturing solidified ingots of silicon of high quality at low costs.

Attempting to reduce the chamber height and secure a long length of solidified ingot requires the power supply section to be located under the chamber. When power is supplied under the chamber, the solidified ingot of silicon is extracted from the chamber without decreasing its temperature and a drastic temperature variation may cause cracking on the surface. To continue continuous casting, it is necessary to cut the solidified ingot of silicon under the chamber every time a certain length of ingot is cast, but since the temperature at the cut section increases, there is a danger that the cutting blade will not be able to withstand the heat, making the cutting difficult.

It is an object of the present invention to provide a silicon continuous casting method capable of suppressing concave shaping of the solid-liquid interface, which presents a problem in silicon continuous casting using electromagnetic induction heating, also suppressing temperature gradient in the direction of the radius of solidified ingots of silicon immediately after solidification even in case of fast casting, improving the performance and thereby manufacturing high quality solidified ingots of silicon at lower costs.

It is another object of the present invention to provide a silicon continuous casting method capable of stably suppressing power loss and heat generation of solidified ingots when power is supplied to the ingots, which presents a problem when plasma heating using transferred plasma arc is used and thereby manufacturing high quality solidified ingots of silicon at lower costs.

DISCLOSURE OF THE INVENTION

A first silicon continuous casting method of the present invention uses at least plasma arc heating as the heating source to melt silicon raw materials, allows the silicon melt in the bottomless crucible formed by this heating source to descend and solidify and extracts solidified ingots of silicon from the bottomless crucible continuously, and is characterized by moving a plasma arc torch for scanning in the horizontal direction on the silicon melt in the bottomless crucible.

The first silicon continuous casting method of the present invention not only suppresses convection of the silicon melt by electromagnetic force but also prevents the conspicuous growing of the concave shape of the solid-liquid interface by plasma arc heating by scanning of the plasma arc torch and thereby flattens the solid-liquid interface. This flattening also makes it possible to enhance heat insulation of the side of ingots immediately after solidification. Enhancement of heat insulation of the side of ingots means shortening of the length from the lower end of the induction coil to the lower end of the bottomless crucible which constitutes the cooling section. This reduces temperature gradient in the direction of the radius of solidified ingots of silicon immediately after solidification which has serious influences on the quality as a solar cell and improves the quality.

That is, by reducing electromagnetic induction heating and combining it with scanning of the plasma arc torch, it is possible to obtain the same effect as keeping warm the side of ingots immediately after solidification. Furthermore, even in case of fast casting, preventing the conspicuous growing of the concave shape of the solid-liquid interface makes it possible to secure high quality. Furthermore, additional raw materials are effectively melted.

As the plasma arc here, transferred plasma arc in which the solidified ingot of silicon becomes the opposite electrode is preferable. Use of the transferred plasma arc makes it possible to set thermal efficiency and output for silicon melting to a high level and also reduces consumption of plasma gas.

As the plasma gas, argon gas is generally used, but use of helium gas or combined argon-hydrogen gas further increases the amount of heat and improves the melting performance.

As the heating source to form a silicon melt inside the bottomless crucible, it is preferable to use electromagnetic induction heating and plasma arc heating concurrently. The electromagnetic induction output is inhibited due to flattening of the solid-liquid interface during casting, but reducing this to 0 eliminates a repulsive force acting between the bottomless crucible and silicon melt, making it more difficult to extract solidified ingots of silicon. That is, during casting, it is the most preferable mode to mainly use plasma arc heating and reduce electromagnetic induction heating to a minimum necessary output to generate electromagnetic force to extract solidified ingots of silicon.

Scanning of the plasma arc torch is the important component as well as use of plasma in the present invention. It is desirable to perform this scanning on the peripheral section whose distance from the inner surface of the crucible to the center of the torch represents 30% or less of the diameter of the crucible along the inner surface. When the scanning range is inclined toward the central area, the effect of reducing the concave shape of the solid-liquid interface is also reduced, preventing the quality of solidified ingots from improving sufficiently. Bringing the plasma arc torch too close to the inner surface of the crucible causes problems such as the torch contacting the inner surface of the crucible and side arc, which will be described later. However, this is dependent on the diameter of the torch and therefore no special lower limit is specified for the distance from the inner surface of the crucible to the center of the torch. In terms of the distance from the inner surface of the crucible to the outer surface of the torch, it is desirable to keep a distance of 5 mm or more.

The scanning speed of the plasma arc torch is preferably 50 to 300 cm/min on the average. In case of low-speed scanning of less than 50 cm/min, unmelted raw materials are accumulated in one scanning cycle, which deteriorates solubility of raw materials. In case of fast scanning exceeding 300 cm/min, since thermal density reduces, solubility of raw material deteriorates.

Since the bottomless crucible is electrically conductive, plasma arc heating presents problems like damage of the inner surface of the crucible by side arc between the inner surface of the crucible and the plasma arc torch and insolubility of silicon. Since the present invention mainly scans the peripheral section along the inner surface of the crucible, it is important to prevent this side arc. From this standpoint, it is preferable to electrically insulate the bottomless crucible from the melting chamber in which the bottomless crucible is accommodated, the positive and negative electrodes of the plasma arc torch and a heat insulation furnace installed under the bottomless crucible. It is more preferable to insulate the inner surface of the crucible with a shield such as a quartz plate in the area above the top end of the induction coil, surround the top end of the torch with a tubular silicon shield made of silicon to enhance insulation between the inside of the coil and the inner surface of the crucible.

Furthermore, a second silicon continuous casting method of the present invention uses at least transferred plasma arc as the heating source for melting silicon raw materials, allows the silicon melt in the bottomless crucible formed by this heating source to descend and solidify and thereby extracts solidified ingots of silicon from the bottomless crucible continuously, and is characterized by allowing the plasma electrode on the ingot side to generate transferred plasma arc to contact the surface of the ingot at a position where the ingot temperature becomes 500° C. to 900° C.

The second silicon continuous casting method of the present invention inhibits convection of the silicon melt by electromagnetic force and flattens the solid-liquid interface. This flattening also allows enhancement of heat insulation of the side of solidified ingots. Enhancement of heat insulation of the side of solidified ingots means shortening of the length from the lower end of the inductive coil to the lower end of the bottomless crucible which constitutes the cooling section. This reduces temperature gradient in the direction of the radius of solidified ingots of silicon immediately after solidification which causes serious influence on the quality as a solar cell and improves the quality.

Since plasma used is a transferred plasma in particular, it is possible to set the thermal efficiency and output for silicon melting to a high level and reduce consumption of plasma gas. Furthermore, heat insulation of ingots immediately after solidification by Joule heat produced by a plasma current flowing through the solidified ingots of silicon can also be expected.

Though the second silicon continuous casting method of the present invention uses high efficiency plasma heating using such transferred plasma arc, the plasma electrode on the ingot side contacts the surface of the ingot at a position where the ingot temperature becomes 500° C. to 900° C., or preferably at a constant position, thus preventing a significant voltage drop under the electrode contact position, which drastically suppresses consumption of plasma power. Furthermore, avoiding significant Joule heating under the electrode contact position drastically reduces the temperature when the ingot is extracted from the chamber, preventing cracking on the surface of ingots and abnormal wear of the cutting blade etc.

That is, when an increase in the voltage drop in the ingots is viewed in the extracting direction, the voltage drop starts to increase drastically from the area where the ingot temperature decreases to approximately 600° C., reaches 300 V (in case of a square ingot of 16 cm per side) at approximately 500° C. and continues to increase thereafter (see FIG. 14). When the voltage drop exceeds 300 V, heating of the ingot itself becomes conspicuous and the ingot temperature no longer decreases. To compensate for that large voltage drop, it is necessary to increase the supply voltage. Allowing the plasma electrode on the ingot side to contact the surface of the ingot in the area where the ingot temperature is 500° C. or above avoids this conspicuous voltage drop and Joule heating. However, if the ingot temperature at the electrode contact position exceeds 900° C., power supply is difficult due to thermal deformation or thermal softening of the electrode. By the way, the ingot temperature according to the present invention is a surface temperature.

The plasma electrode on the ingot side contacts the surface of the ingot at a high temperature and produces movements relative to the surface of the ingot, and therefore it is necessary to consider thermal resistance and high temperature wear resistance. From this point of view, it is desirable to use a plasma electrode on the ingot side which elastically contacts the surface of the ingot through elastic force of a metal or a roller made of electrically conductive material such as metal and graphite.

As the heating source to form a silicon melt inside the bottomless crucible, it is desirable to use electromagnetic induction heating and plasma arc heating concurrently. During casting, the electromagnetic induction output is suppressed to prevent concave shaping of the solid-liquid interface, but reducing this to 0 will eliminate the repulsive force acting between the bottomless crucible and silicon melt and makes it more difficult to extract solidified ingots of silicon. That is, it is the most preferable mode to mainly use plasma arc heating during casting and reduce electromagnetic induction heating to a minimum necessary output to generate electromagnetic force to extract solidified ingots of silicon.

BRIEF DESCRIPTION OF THE DRAWINGS

FIG. 1 is a block diagram of a continuous casting apparatus suitable for carrying out a first silicon continuous casting method of the present invention;

FIG. 7 is a diagram showing a relationship between a temperature difference in the direction of a radius of a solidified ingot immediately after solidification and a size of the solidified ingot according to the method of the present invention and a comparative method;

FIG. 13 is a detailed block diagram of the power supply section showing a further power supply structure;

BEST MODE FOR CARRYING OUT THE INVENTION

With reference now to the attached drawings, embodiments of the present invention will be explained below.

A first silicon continuous casting method of the present invention will be explained with reference to FIG. 1 to FIG. 9.

Figure 2:
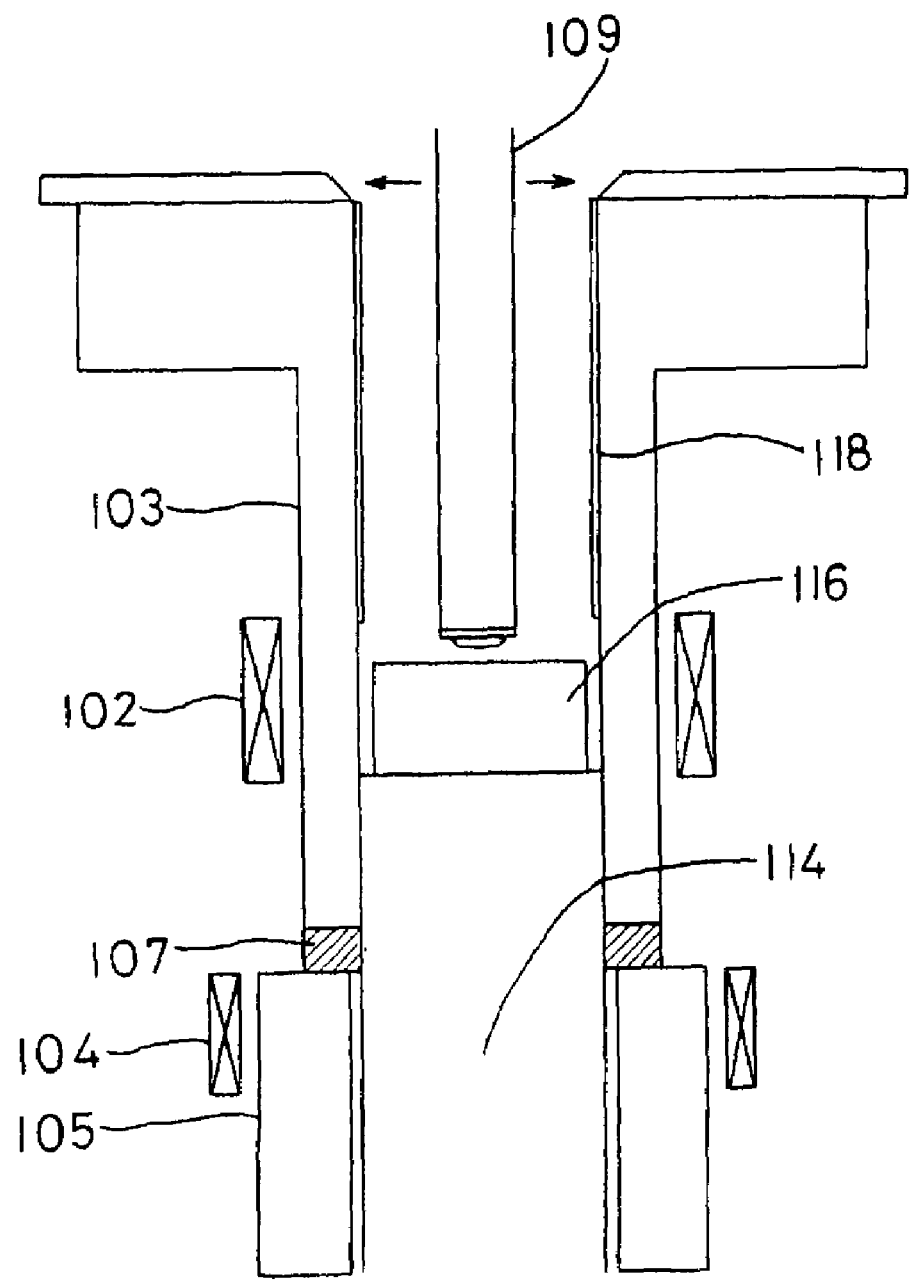
FIG. 2 is a longitudinal cross-sectional view of an upper part of the apparatus showing an operation during initial melting.
Figure 3:
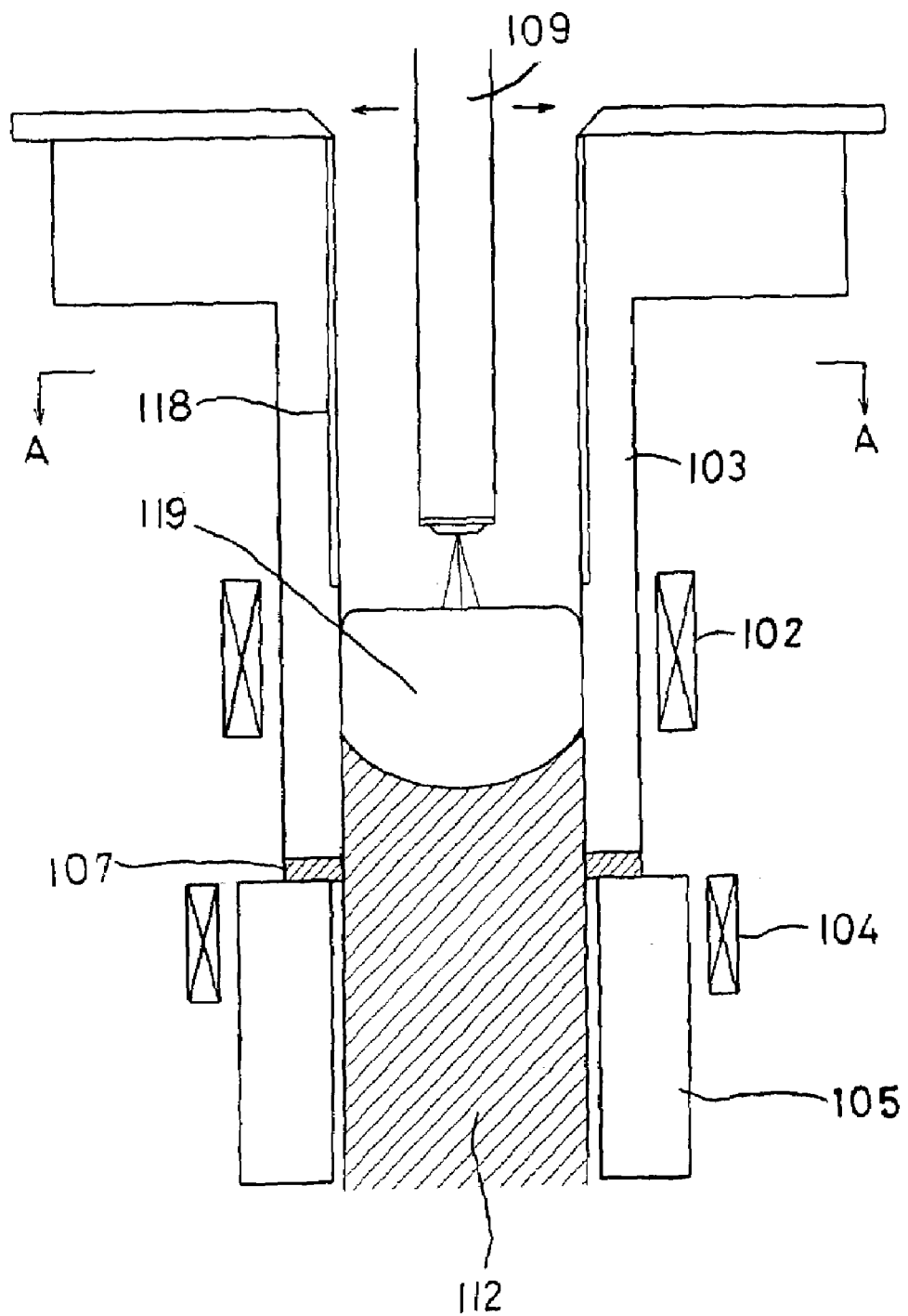
FIG. 3 is a longitudinal cross-sectional view of the upper part of the apparatus showing an operation during casting.
Figure 4:
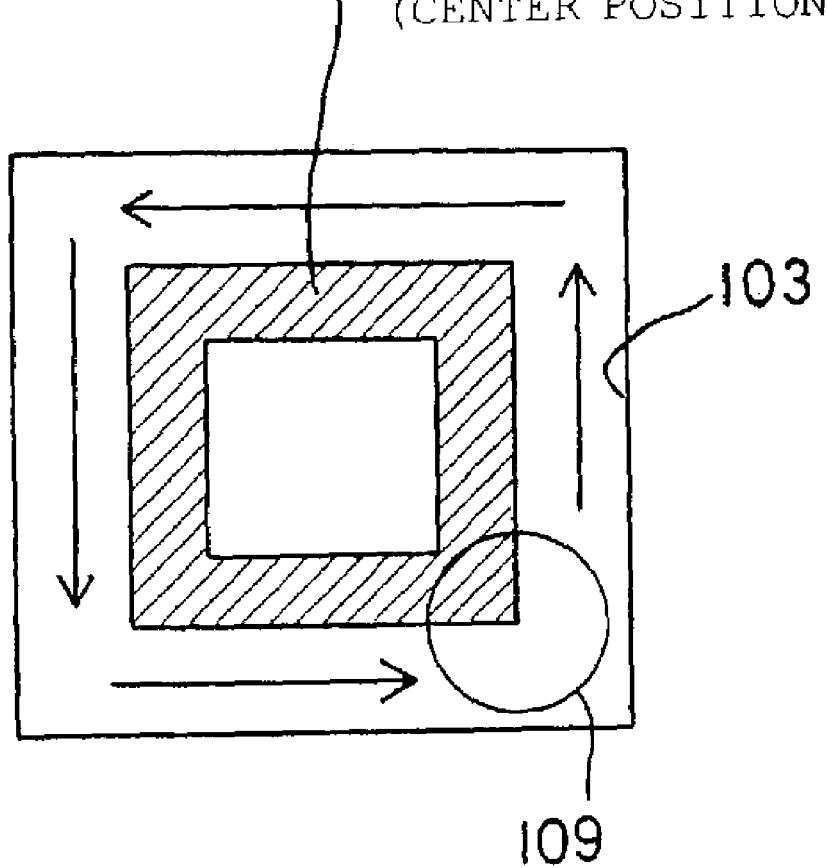
FIG. 4 is an A—A line arrow view of FIG. 3.

FIG. 1 is a block diagram of a continuous casting apparatus suitable for carrying out a first silicon continuous casting method of the present invention, FIG. 2 is a longitudinal cross-sectional view of the upper part of the apparatus showing an operation during initial melting, FIG. 3 is a longitudinal cross-sectional view of the upper part of the apparatus showing an operation during casting and FIG. 4 is an A—A line arrow view of FIG. 3.

As shown in FIG. 1, the continuous casting apparatus is provided with a chamber 101 to keep a casting atmosphere. To keep this casting atmosphere, an inert gas is circulated in the chamber 101 from a gas inlet 101a to a gas outlet 101b. Inside the chamber 101 is a square tubular bottomless crucible 103 combined with an induction coil 102. Under the bottomless crucible 103 is a first heat insulation furnace 105 based on an induction heating system combined with an induction coil 104 and a second heat insulation furnace 106 of a temperature gradient type thereunder.

The bottomless crucible 103 is made of an electrically conductive material such as copper and manufactures solidified ingots of silicon 112 continuously in cooperation with the induction coil 102 and a plasma arc torch 109, which will be described later. For this manufacture, the bottomless crucible 103 is forcibly water-cooled with cooling water circulating inside and divided into a plurality of portions in the circumferential direction except the upper part. Furthermore, the bottomless crucible 103 is insulated from the first heat insulation furnace 105 thereunder by means of an insulating material 107.

Silicon raw materials 113 are charged from a raw material hopper provided outside the chamber 101 through a duct 108 into the bottomless crucible 103. In order to heat the charged raw materials, the plasma arc torch 109 is inserted vertically from above into the bottomless crucible 103.

The plasma arc torch 109 is of a transferable type and connected to the cathode of a plasma power supply 110. The anode of the plasma power supply 110 is connected to support devices 111, 111 to support the solidified ingots of silicon 112 under the chamber 101 and grounded. This plasma arc torch 109 is driven to swing in two X, Y directions for horizontal scanning and driven to move straight in the Z direction for ascent or descent.

Next, the method of manufacturing solidified ingots of silicon 112 continuously using this continuous casting apparatus will be explained.

First, as shown in FIG. 2, an initial pseudo-ingot 114 to support solidified ingots of silicon are set in the first heat insulation furnace 105. Initial raw materials 116 are mounted on the initial pseudo-ingots 114. The initial raw materials 116 are put in the bottomless crucible 103 and located inside the induction coil 102. The initial pseudo-ingot 114 is mechanically connected to a support and extraction bar (not shown) thereunder.

When the above-described preparation is completed, the plasma arc torch 109 is oriented toward the central area of the upper surface of the initial raw materials 116 to generate plasma arc between the plasma arc torch 109 and the initial raw materials 116. To prevent side arc between the plasma arc torch 109 and the inner surface of the bottomless crucible 103, a shield 118 made of quartz is pasted to the inner surface of the crucible from the top end of the induction coil 102 above so that the plasma arc torch 109 is insulated from the inner surface of the crucible above the induction coil 102.

When plasma arc is generated between the plasma arc torch 109 and the initial raw materials 116, the initial raw materials 116 are melted and silicon melt 119 is formed on the initial pseudo-ingot 114 (see FIG. 1). When the initial raw materials 116 are melted, the electric resistance thereof decreases and therefore plasma arc is stabilized and the danger of side arc is reduced.

To promote melting of the initial raw materials 116, the plasma arc torch 109 is moved for scanning in the horizontal direction along the inner surface of the bottomless crucible 103 (see FIG. 4). Since the bottomless crucible 103 is electrically insulated from surrounding electrically conductive objects including the heat insulating furnace thereunder and further provided with the shield 118 made of quartz on its inner surface, no side arc is generated even if the vicinity of the inner surface is scanned by the plasma arc torch 109.

When the above initial melting is completed, as shown in FIG. 3 and FIG. 4, the silicon melt 119 formed inside the coil in the bottomless crucible 103 is allowed to descend gradually to solidify. At the same time, the silicon raw materials 113 are additionally charged into the silicon melt 119 and the additional raw materials are melted through the concurrent use of induction heating by a combination of the induction coil 102 and bottomless crucible 103 and plasma heating by the plasma arc torch 109. By continuing this operation, the solidified ingots of silicon 112 are extracted continuously from the bottomless crucible 103. These solidified ingots of silicon 112 further continue to descend while being kept warm by the first heat insulating furnace 105 and second heat insulating furnace 106 thereunder and are extracted down below the chamber 101.

Thus, the unidirectionally solidified ingots of silicon 112 are manufactured continuously.

During this casting, the plasma arc torch 109 for plasma heating is moved for scanning in the horizontal direction along the inner surface of the bottomless crucible 103 above the silicon melt 119 inside the bottomless crucible 103. Because of the scanning of the plasma arc torch 109, the downward concave shape of the solid-liquid interface inside the bottomless crucible 103 is drastically alleviated and effectively flattened even in case of fast casting. This flattening makes it possible to reduce the length from the lower end of the coil to the lower end of the crucible which constitutes the cooling section of the bottomless crucible 103 and enhance heat insulation of the side of the solidified ingots. This suppresses temperature gradient in the direction of the radius of solidified ingots immediately after solidification which has serious influences on the quality as a solar cell and improves the quality. Moreover, this high quality can be achieved at lower costs through fast casting.

At the time of finishing the casting, charging of the silicon raw materials 113 is stopped, the silicon melt 119 in the bottomless crucible 103 is allowed to descend and solidify. At this time, the plasma arc torch 109 is lowered as the silicon melt 119 descends.

Figure 5:
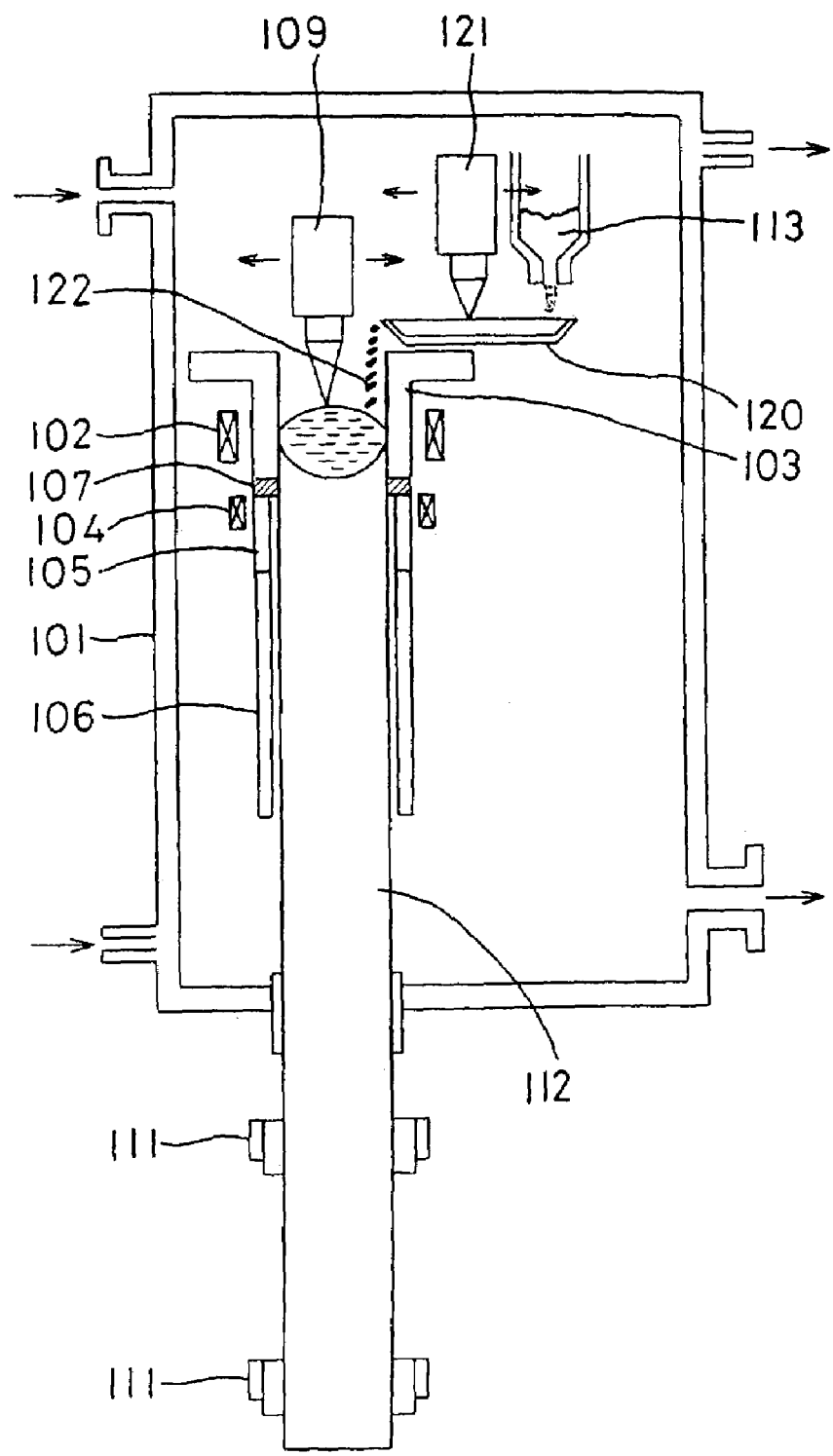
FIG. 5 is a block diagram of another continuous casting apparatus suitable for carrying out the first silicon continuous casting method of the present invention.

FIG. 1 to FIG. 4 show the case where the solid silicon raw materials 113 are directly charged into the bottomless crucible 103, but as shown in FIG. 5, it is also possible to melt the solid silicon raw materials 113 in a water-cooled melting hearth 120 by a plasma arc torch 121 and add its silicon melt 122 to the silicon melt 119 inside the bottomless crucible 103.

Figure 6:
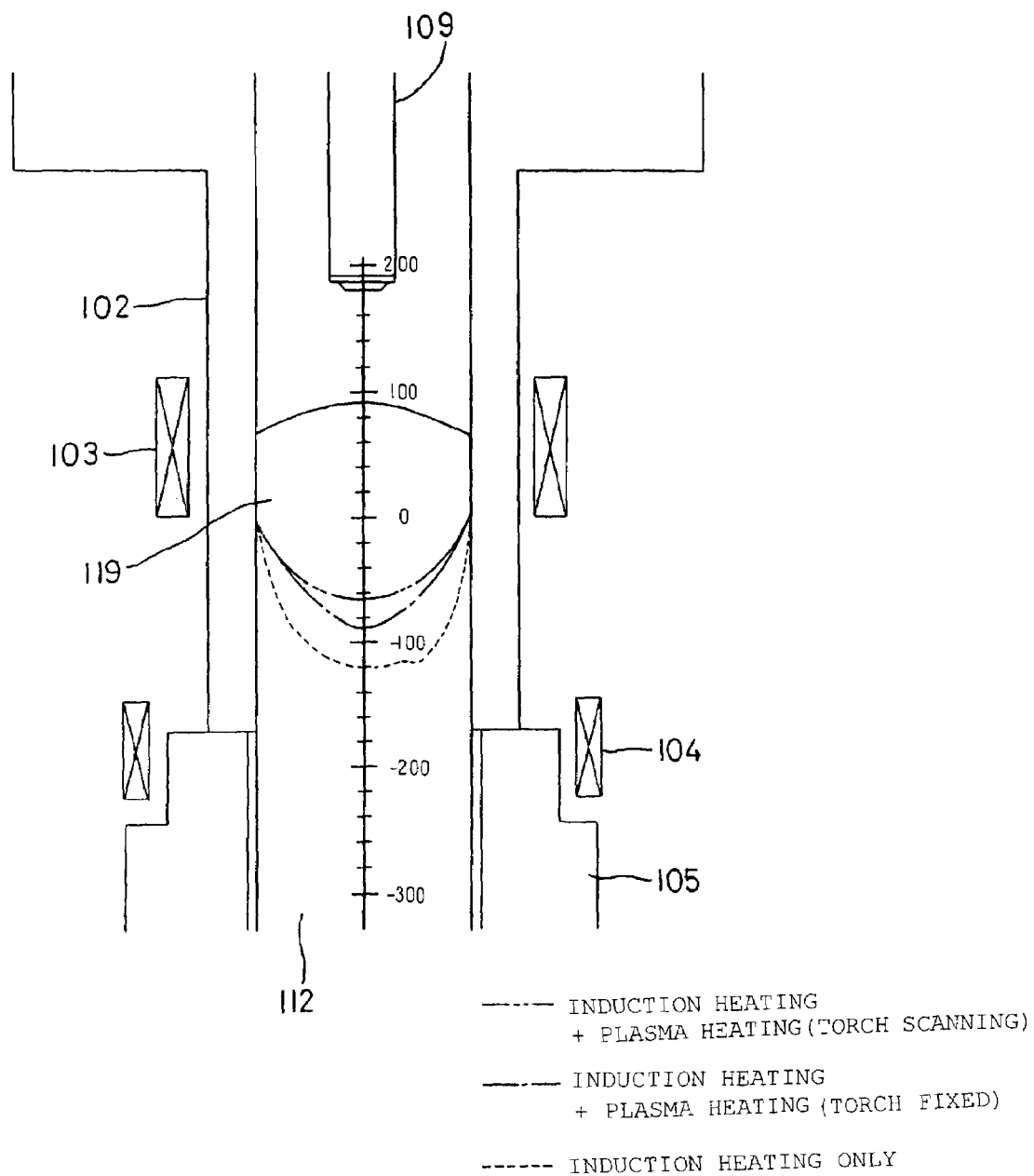
FIG. 6 is a diagram showing a depth of recession of a solid-liquid interface in a bottomless crucible according to the method of the present invention and a comparative method.

FIG. 6 is a diagram showing a depth of recession of the solid-liquid interface in the bottomless crucible according to the method of the present invention and a comparative method. The size of a solidified ingot is 16 cm per side and the casting speed is 2 mm/min. Furthermore, the length from the lower end of the coil to the lower end of the crucible which constitutes the cooling section of the bottomless crucible is 17 cm (constant).

In case of induction heating alone, the solid-liquid interface in the bottomless crucible is recessed from the lower end of the coil as deep as 100 mm or more. This recession can be reduced by using plasma heating concurrently and reducing the induction heating output, but when plasma heating is fixed to the central area, this recession is close to 100 mm. However, moving the plasma arc torch for scanning along the inner surface of the cubicle reduces this recession by nearly half that in case of using induction heating alone.

FIG. 7 is a diagram showing a relationship between a temperature difference in the direction of a radius of the solidified ingot immediately after solidification and the size of the solidified ingot according to the method of the present invention and a comparative method. This temperature difference is a difference (Tc–Ts) between central area temperature Tc on the section that passes through the center of the solid-liquid interface and solidified ingot side temperature Ts and temperature gradient ΔT in the direction of the radius is expressed using solidified ingot radius r as ΔT= (Tc–Ts)/r. By the way, the radius of the solidified ingot, when the solidified ingot is a square, is ½ of the length of one side.

If the casting mode is the same, the temperature gradient ΔT in the direction of the radius is basically the same, and therefore the temperature difference (Tc–Ts) increases as the size of the solidified ingot increases. The temperature gradient ΔT in the direction of the radius immediately after solidification is smaller when induction heating and plasma heating are combined than when only induction heating is used as the casting mode and is especially small when torch scanning is performed using that plasma heating.

When the temperature gradient ΔT is calculated based on temperature differences for various sizes of solidified ingots, ΔT is 19 to 24° C./cm when only induction heating is used, while ΔT is reduced to 12 to 16° C./cm when plasma heating is used in combination.

Table 1 shows a relationship between measurement results of temperature gradient ΔT and conversion efficiency of the manufactured solidified ingot of silicon as a solar cell when the size of the solidified ingot is 16 cm per side and casting speed is 2 mm/min. The temperature gradient ΔT reaches a minimum and the conversion efficiency is considerably high when induction heating and plasma heating are used in combination and torch scanning is performed with that plasma heating.

TABLE 1

| | Scanning position (inner surface of crucible to center of torch) (cm) | Ratio of scanning position to diameter of crucible (%) | Scanning speed (cm/min) | Raw material melting situation | Depth of solid-liquid interface (mm) |
|---|---|---|---|---|---|
| Examples of present invention | 3 | 18.8 | 50 | ; | 70 |
| | 3 | 18.8 | 100 | T | 71 |
| | 3 | 18.8 | 300 | ; | 69 |
| | 4 | 25 | 100 | T | 79 |
| | 5 | 31.3 | 100 | ; | 85 |
| | 3 | 18.8 | 400 | < | 70 |
| | 3 | 18.8 | 30 | < | 71 |
| Comparative example | — | — | — | x | 94 |

Figure 8:
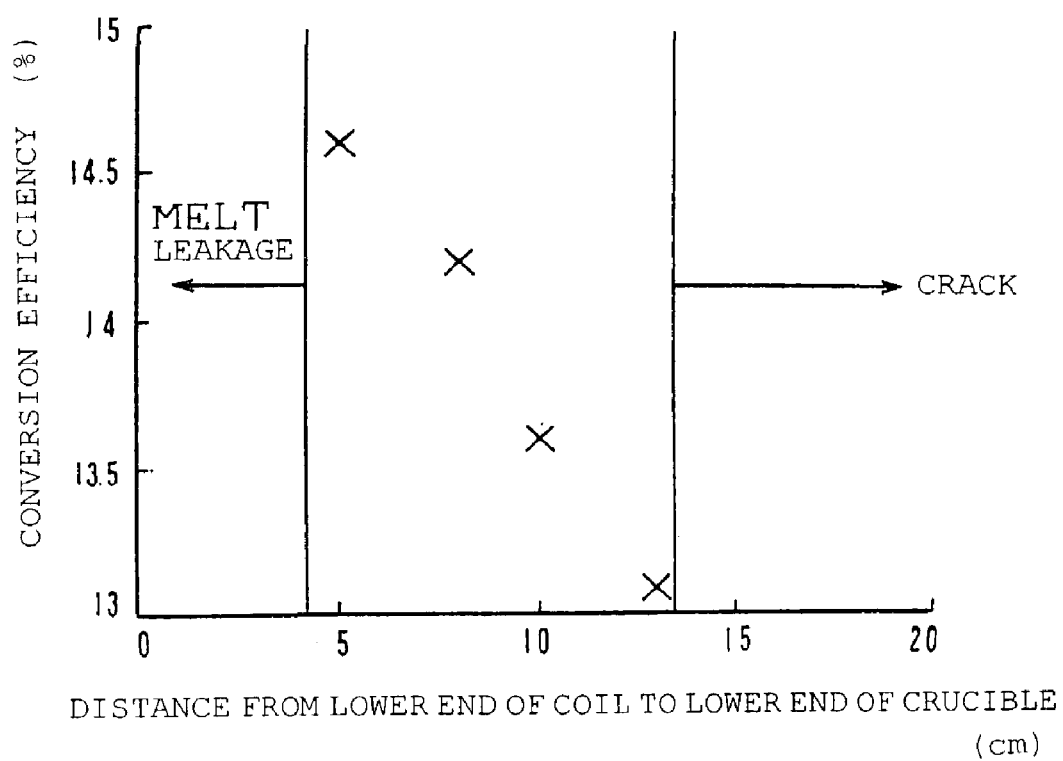
FIG. 8 is a graph showing a relationship between a length of a cooling section of the bottomless crucible and solidified ingot quality when induction heating and plasma heating are used concurrently and when torch scanning is performed with that plasma heating.

FIG. 8 is a graph showing a relationship between a length of the cooling section of the bottomless crucible and quality of the solidified ingot when induction heating and plasma heating are used concurrently and when torch scanning is performed with that plasma heating. The size of the solidified ingot is 16 cm per side and casting speed is 2 mm/min. The length of the cooling section of the bottomless crucible id the distance from the lower end of the coil to the lower end of the crucible. Since this section promotes heat loss from the surface of the solidified ingot immediately after solidification, it is preferable to have a shorter cooling section from the standpoint of the quality of the solidified ingot, but if it is too short, the solidified shell may break and cause leakage of melt.

When induction heating and plasma heating are used in combination and torch scanning is performed using that plasma heating, the length of this cooling section can be shortened down to 4 cm, which provides solidified ingots of higher quality. Moreover, solidified ingots of comparatively high quality are secured even at a length of 13 cm. When the length of the cooling section is too large, cracking may occur due to rapid cooling. By the way, the allowable minimum length of the cooling section according to the comparative method is 8 cm in case of induction heating alone and 5 cm in case of combined use of induction heating and plasma heating and a fixed torch (no scanning).

Figure 9:
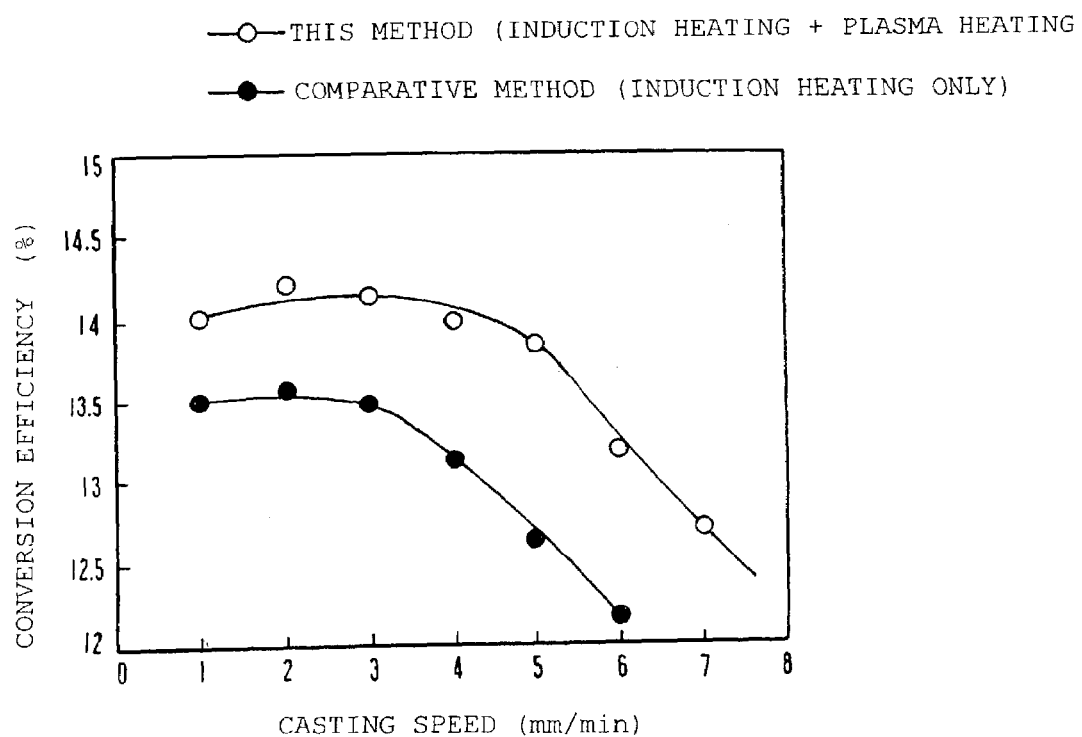
FIG. 9 is a diagram showing a relationship between a casting speed and quality of the solidified ingot according to the method of the present invention and a comparative method.

FIG. 9 is a diagram showing a relationship between a casting speed and ingot quality according to the method of the present invention and a comparative method. In both cases, if the casting speed exceeds a specific critical value, the conversion efficiency reduces drastically, but in case of induction heating alone, this reduction starts at a casting speed of 2 mm/min and the conversion efficiency remains 13% even at a casting speed equal to or lower than this critical value. When induction heating and plasma heating are used in combination, the conversion efficiency starts to drop and the critical speed increases and at the same time the conversion efficiency also improves at a speed equal to or lower than the critical speed. Especially when torch scanning is performed with plasma heating, a conversion efficiency of 13.5% is obtained at a casting speed of 5 mm/min or less and a conversion efficiency exceeding 14% is obtained at a casting speed of 4 mm/min or less.

Then, the result of an investigation of influences of the plasma arc torch scanning condition on the depth of recession of a solid-liquid interface and raw material melting situation will be explained.

When a solidified ingot of 16 cm per side is manufactured at a casting speed of 2 mm/min, induction heating and plasma heating were used in combination and the plasma arc torch was moved for scanning along the inner surface of the crucible in a square course. The inner diameter of the crucible is 16 cm (length of one side) and the outer diameter of the torch is 5 cm. The scanning course is expressed by the distance (scanning position) from the inner surface of the crucible to the center of the torch and ratio of this distance to the inner diameter of the crucible. When this distance is 2.5 cm or below, the torch touches the inner surface of the crucible. Table 2 shows the investigation result.

In a comparative example with the torch fixed at the central area, the depth of recession of the solid-liquid interface is close to 10 mm (see FIG. 6). Raw materials remained unmelted in the periphery. In contrast, according to the present invention where the torch is moved in a square form along the inner surface of the crucible around the central area, the depth of recession of the solid-liquid interface is reduced and the raw material melting situation also improves. Especially, when the distance from the inner surface of the crucible to the center of the torch is 30% or less of the inner diameter of the crucible (here, approximately 5 cm or less), the depth of recession of the solid-liquid interface is especially reduced and the raw material melting situation is also favorable. However, even if the scanning range is optimal, when the scanning speed is too high or too low, the solubility of the raw material reduces.

TABLE 2

| Heating method | Temperature gradient in radial direction (° C./cm) | Conversion efficiency (%) |
| --- | --- | --- |
| Plasma (scanning) + electromagnetic induction | 7.0 | 14.5 |
| Plasma (fixed) + electromagnetic induction | 8.6 | 14.2 |
| Electromagnetic induction | 10.1 | 13.8 |

Table 3 shows the result of an investigation of influences of the output ratio when induction heating and plasma heating are used in combination on the depth of recession of the solid-liquid interface and quality of the solidified ingots. The induction heating output is expressed as Pi and plasma heating output is expressed as Pp. The size of the solidified ingot is 16 cm per side, induction frequency is 20 kHz and casting speed is 2 mm/min, and the torch was moved during plasma heating.

TABLE 3

| Pi (kW) | Pp (kW) | Pp/Pi | Depth of solid-liquid interface (mm) | Conversion efficiency (%) |
| --- | --- | --- | --- | --- |
| 230 | 0 | 0 | 138 | 13.7 |
| 150 | 25 | 0.17 | 125 | 13.8 |
| 100 | 46 | 0.46 | 112 | 14.2 |
| 70 | 60 | 0.86 | 106 | 14.5 |
| 70 | 72 | 1.03 | 135 | 13.7 |

When plasma heating output Pp is 0, induction heating output Pi needs to be 230 kW. As a result, the depth of recession of the solid-liquid interface reaches 138 mm and the conversion efficiency remains 13.7%. Simultaneous use of plasma heating makes it possible to reduce induction heating output Pi and as a result, the depth of recession of the solid-liquid interface is reduced while the conversion efficiency improves. Compared with plasma heating output Pp, the reduction width of induction heating output Pi is large, plasma heating output Pp is approximately 40 kW and induction heating output Pi is reduced by half from initial 230 kW.

Plasma heating output Pp is preferred to be 0.15 or above as a ratio with respect to induction heating output Pi (Pp/Pi). However, an extreme increase of the plasma heating output Pp weakens repulsive force of the induction heating output Pi and deteriorates the extraction performance of solidified ingots from the bottomless crucible, and therefore the upper limit of the plasma heating output Pp is preferred to be 0.9 or less as a ratio with respect to induction heating output Pi (Pp/Pi).

Furthermore, the induction heating output Pi has a minimum necessary output. It is 70 kW according to Table 3. This is attributable to a reduction of pinching force due to a reduction of the induction heating output Pi and the presence of unmelted raw materials caused by an increased heat of extraction due to an expansion of area of contact with the water-cooled copper crucible. When the plasma heating output Pp is increased in this condition, the solid-liquid interface is contrarily deepened and the conversion efficiency also deteriorates. As the countermeasure for this, it is effective to reduce an induction frequency. Reducing the induction frequency increases the coil current even if the output remains unchanged, and therefore the pinching force increases making it possible to further increase the plasma heating output Pp.

Then, an embodiment of a second silicon continuous casting method of the present invention will be explained by using FIG. 10 to FIG. 14.

Figure 10:
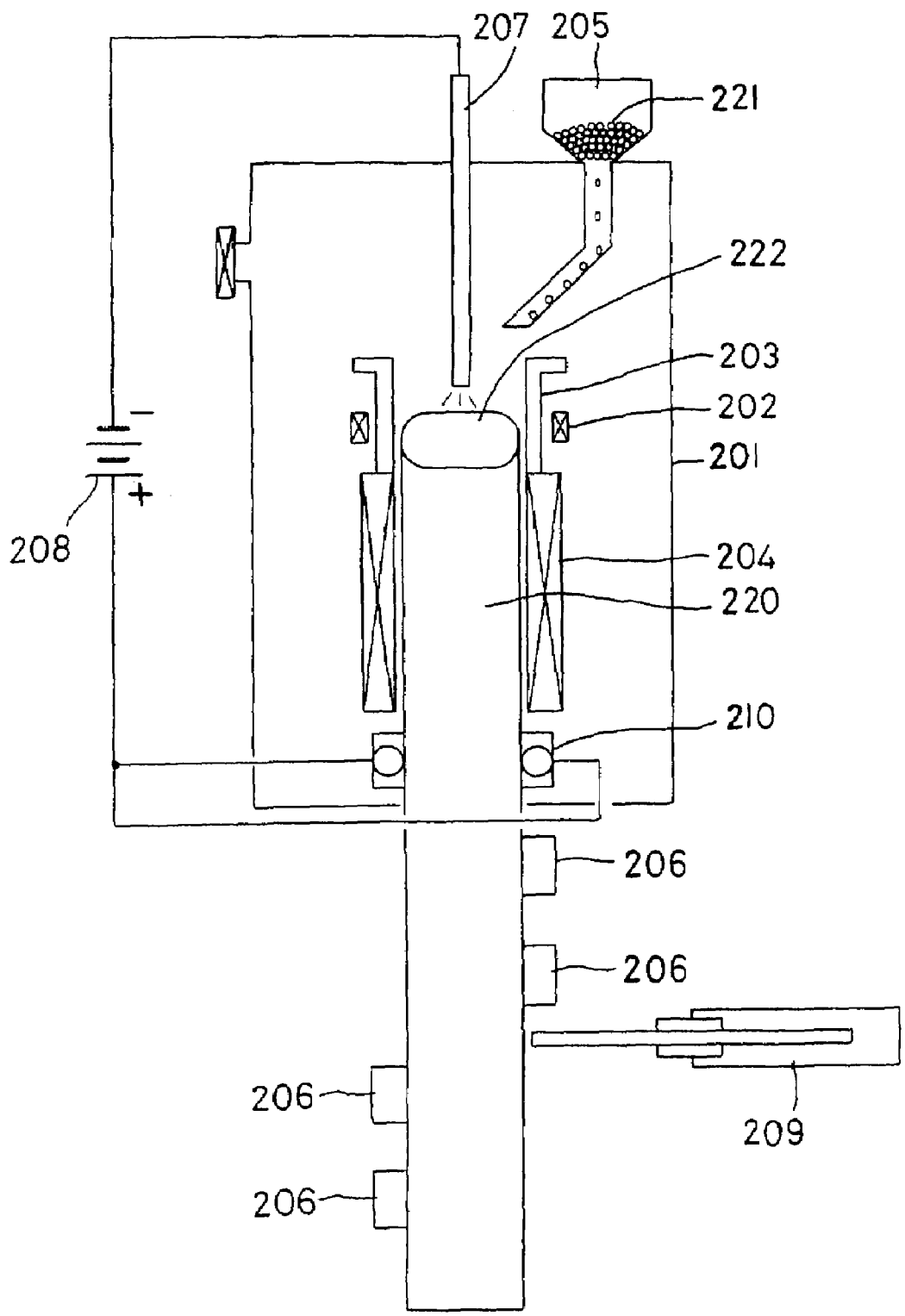
FIG. 10 is a block diagram of a continuous casting apparatus suitable for carrying out a second silicon continuous casting method of the present invention.
Figure 11:
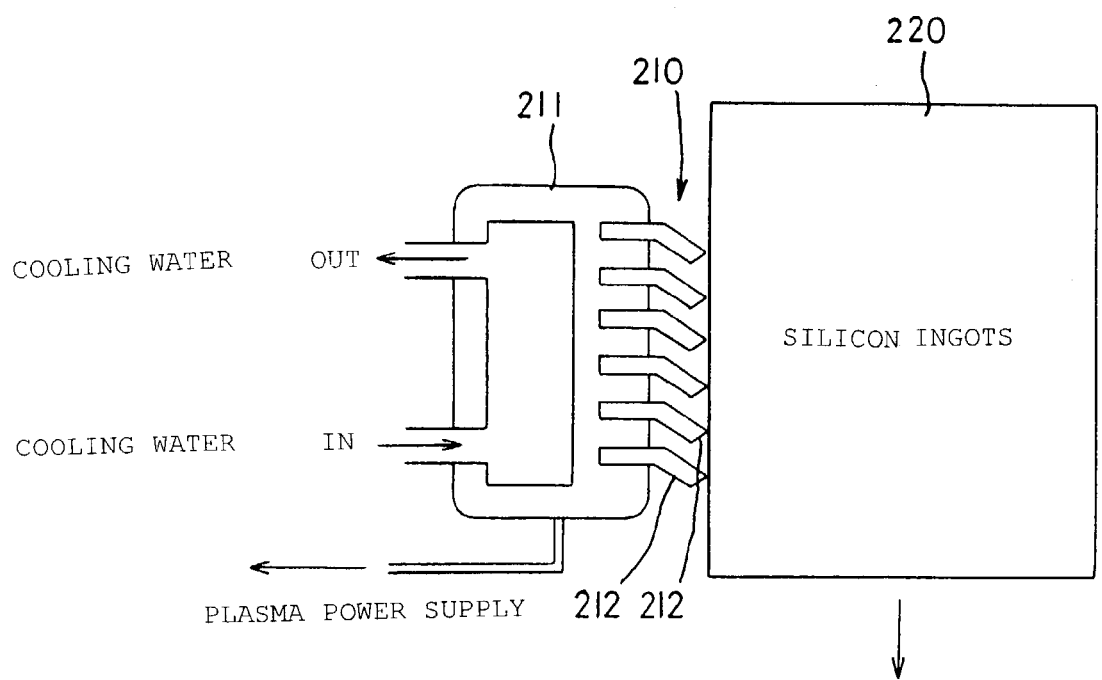
FIG. 11 is a detailed block diagram of the power supply section of the above-described continuous casting apparatus.

FIG. 10 is a block diagram of a continuous casting apparatus suitable for carrying out the second silicon continuous casting method of the present invention and FIG. 11 is a detailed block diagram of the power supply section of the same continuous casting apparatus.

As shown in FIG. 10, the continuous casting apparatus is used for continuous manufacturing of solidified ingots of silicon 220 for a solar cell. Inside the chamber 201 to maintain a casting atmosphere, a square-tubular bottomless crucible 203 combined with an induction coil 202 is placed, which is followed by a heater 204 for heat insulation under the bottomless crucible 203.

The solidified ingots of silicon 220 are manufactured continuously inside the bottomless crucible 203 through combined use of electromagnetic induction heating and plasma heating and extracted down below the chamber 201 by solidified ingot support devices 206,206 . . . while being thermally insulated by the heater 204.

The bottomless crucible 203 is made of an electrically conductive material such as copper for electromagnetic induction heating, forcibly water-cooled with cooling water circulating inside and divided into a plurality of portions in the circumferential direction except the upper part. The silicon raw materials 221 are charged from a raw material hopper 205 provided outside the chamber 201 through a duct into the bottomless crucible 203. In order to heat and melt the charged raw materials in cooperation with the induction coil 202, a plasma arc torch 207 is inserted vertically from above into the bottomless crucible 203.

The plasma arc torch 207 is of a transferable type and connected to the cathode of a plasma power supply 208. The anode of the plasma power supply 208 is connected to a plasma electrode 210 on the solidified ingot side. This electrode 210 contacts the surface of the solidified ingots of silicon 220 extracted down below the bottomless crucible 203 at a fixed position. The contact position of the electrode 210 is within the chamber 201 in which the temperature of solidified ingots becomes 900 to 500° C.

As shown in FIG. 11, the electrode 210 has such a detailed structure that a plurality of contact fractions 212,212 . . . are implanted in and fixed to the surface of a base member 211 facing the surface of the solidified ingots of silicon 220 as the electrode 210.

The base member 211 is made of an electrically conductive metal such as copper and forcibly cooled with cooling water circulating inside and electrically connected to the anode of the aforementioned plasma power supply 208. The plurality of contact fractions 212,212 . . . functioning as the electrode 210 are thin conductive metal sheets provided with elasticity, placed in parallel at predetermined intervals in the vertical direction in which the solidified ingots of silicon 220 move, and elastically contact the surface of the solidified ingots of silicon 220. As described above, the contact position corresponds to the area in the chamber 201 where the temperature of solidified ingots ranges from 900 to 500° C.

Then, the method of manufacturing the solidified ingots of silicon 220 continuously using this continuous casting apparatus will be explained.

First, a dummy material is inserted from underneath into the bottomless crucible 203 and initial raw materials placed thereupon are melted using the plasma arc torch 207 and induction coil 202 and a silicon melt 222 is formed inside the bottomless crucible 203. Then, while the induction coil 202 applies electromagnetic force to the silicon melt 222, the silicon melt 222 is allowed to descend gradually to solidify. At the same time, the silicon raw materials 221 are additionally charged into the silicon melt 222 and these additional raw materials are melted using electromagnetic induction heating by the induction coil 202 and plasma heating by the plasma arc torch 207 in combination.

By continuing this operation, the solidified ingots of silicon 220 are continuously extracted from the bottomless crucible 203. These solidified ingots of silicon 220 are kept warm by the heater 204 thereunder and continue to descend and are extracted down below the chamber 201. When the solidified ingots of silicon 220 of a predetermined length are manufactured below the chamber 201, the solidified ingots of silicon 220 are cut by a rotational cutting blade 209 directly below the chamber 201.

During this casting, the contact fractions 212,212 . . . functioning as the electrode 210 are bent down as the solidified ingots of silicon 220 descend and elastically contact the high temperature section (900 to 500° C.) of the surface of the solidified ingots without preventing the descent or causing damage and reliably supply power to the solidified ingots of silicon 220. In this way, a plasma current flows from the anode of the plasma power supply 208, electrode 210, solidified ingots of silicon 220, silicon melt 222, plasma arc torch 207 to cathode of the plasma power supply 208, forming a DC circuit. As a result, the plasma current restrictively flows through the high temperature section of the solidified ingot of silicon 220 from the contact position of the electrode 210 to the top end.

Since specific resistance in that high temperature section is relatively small, a voltage drop by the plasma current is small. Thus, an increase of the supply voltage to compensate for this voltage drop is small, suppressing power consumption. The amount of heat by energization is also small, and therefore the temperature of solidified ingots when extracted from the chamber 201 is reduced to a level close to that when plasma heating is not performed, preventing cracking on the surface of solidified ingots by a thermal shock during extraction. Also when the solidified ingots of silicon 220 are cut by the cutting blade 209, the temperature at the cutting section decreases, which prevents abnormal wear of the cutting blade 209. Furthermore, the distance from the top end to the contact position is constant and the total resistance of this section does not vary, and therefore the amount of heat does not vary as the casting advances. This also prevents deterioration of the quality caused by variations in the amount of heat.

Figure 12:
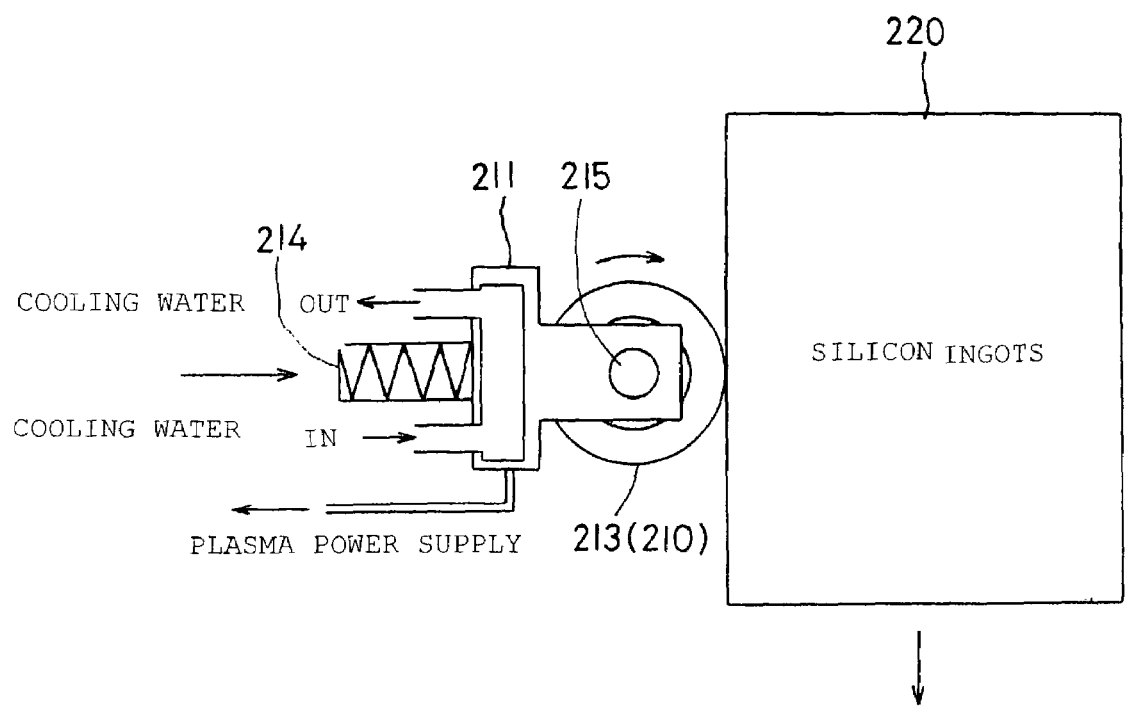
FIG. 12 is a detailed block diagram of the power supply section showing another power supply structure.

FIG. 12 and FIG. 13 show detailed block diagrams of other power supply sections.

FIG. 12 shows a roller 213 functioning as the electrode 210 attached to the side of the base member 211. To press the roller 213 against the surface of the solidified ingots of silicon 220, the base member 211 is pressed against the facing side by means of a spring 214. The roller 213 is made of a soft electrically conductive metal such as copper and is supported by a horizontal shaft 215 parallel to the surface of the ingots in such a way as to be freely pivotable as the solidified ingot of silicon 220 descends.

Furthermore, FIG. 13 shows a plurality of elastic contact fractions 212 implanted on the circumferential surface of the roller 213 at predetermined intervals.

In both power supply structures, the electrode 210 contacts the high temperature surface of the solidified ingots without preventing the descent of or causing damage to the solidified ingots of silicon 220 and reliably supplies power to the solidified ingots of silicon 220.

Figure 14:
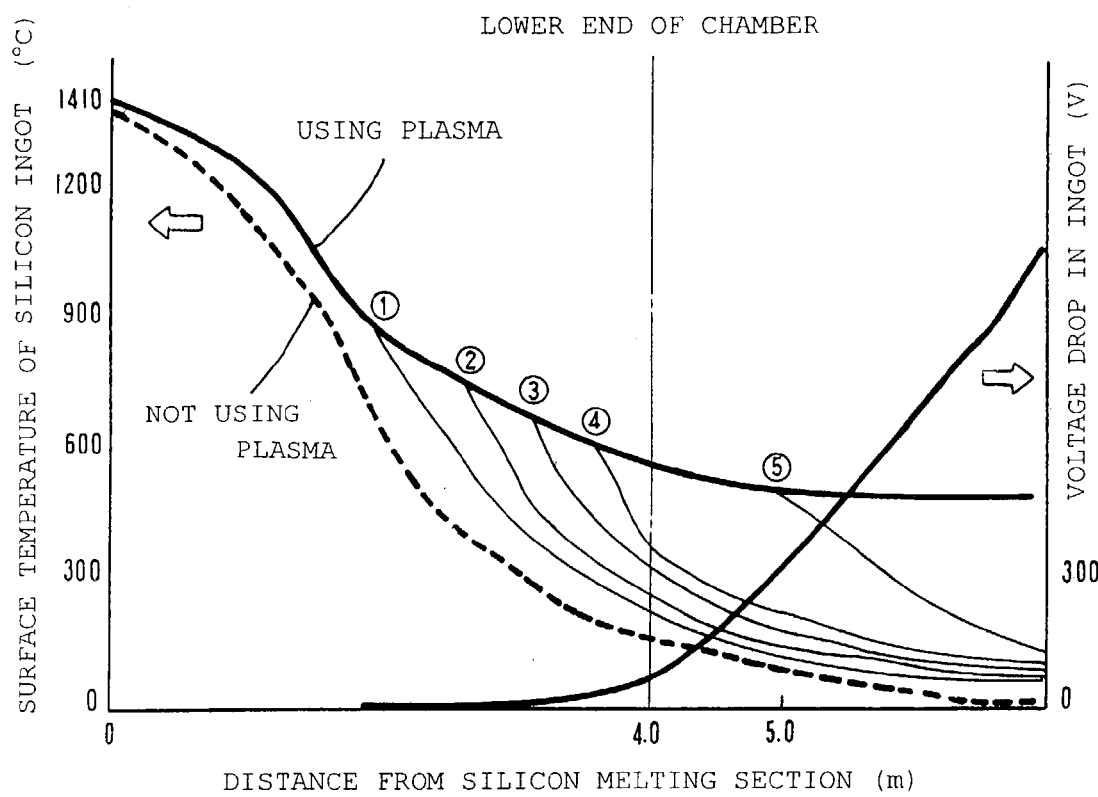
FIG. 14 is a diagram showing influences of the contact position of an electrode that contacts a solidified ingot of silicon on a temperature distribution in the axial direction of the solidified ingot.
Figure 15:
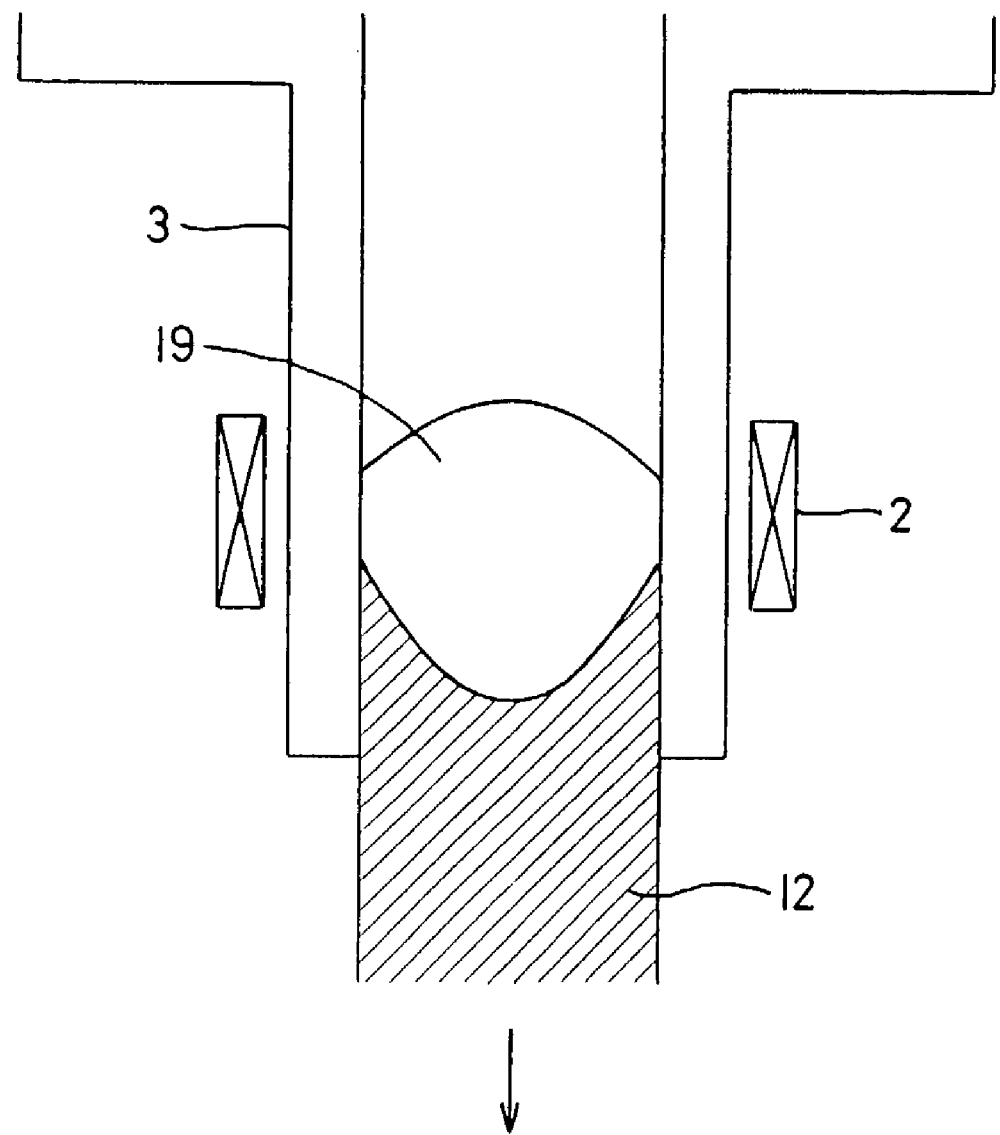
FIG. 15 is a conceptual diagram of a silicon continuous casting method using electromagnetic induction heating.

FIG. 14 is a diagram showing influences of the contact position of an electrode that contacts a solidified ingot of silicon on a temperature distribution in the axial direction of the solidified ingot of 16 cm per side (casting speed of 2 mm/min).

In the drawing, broken line shows a temperature distribution in the axial direction when the plasma electrode does not contact the surface of the solidified ingot, that is, in case of no energization without plasma heating. Rightward descending thick line shows a temperature distribution in the axial direction when the plasma electrode contacts the surface of the solidified ingot at a position of approximately 500° C. outside the chamber 6 m or more distant from the top end. Furthermore, rightward ascending thick line shows a voltage drop in the solidified ingot in the latter for reference.

In case of no energization without plasma heating, the temperature of the solidified ingot descends gradually and smoothly from its maximum of 1410° C. at the top end that contacts the silicon melt as the distance from the top end increases, down to 200° C. at a position approximately 4 m where the ingot is extracted from the chamber. At this temperature, even if the ingot is extracted from the chamber, no cracking due to thermal shock will occur on the surface of the ingot. Moreover, even when the ingot is cut under the chamber, no abnormal wear or damage of the cutting blade occurs.

However, when plasma heating is performed, if the electrode contacts the surface of the ingot at a position of approximately 500° C. outside the chamber 6 m or more distant from the top end, a temperature drop of the solidified ingot is considerably slowed down inside the chamber. The temperature hardly drops from a position 5 m onward in particular. As a result, even at a position 4 m from where the ingot is extracted, the temperature of the ingot remains at 600° C. This is because the temperature of the ingot becomes 500° C. at the position of 5 m, and after this position a voltage drop in the ingot exceeds 300 V and generation of Joule heat by a plasma current becomes conspicuous.

Extracting the ingot from the chamber in this high temperature condition increases the risk that cracking by thermal shock will occur on the surface. On the other hand, when the ingot is cut under the chamber, abnormal wear may occur in the cutting blade because of the high temperature of the ingot. Moreover, the supply voltage needs to be increased considerably to compensate for the voltage drop at and after the position of 5 m, which will present a problem of power loss.

In contrast, at ① to ④ where the electrode contacts the surface of the ingot at a position of 500° C. or higher, the temperature of the ingot decreases drastically after the contact position as shown by thin line. As a result, at the position of 4 m where the ingot is extracted from the chamber, even in case of ④ where the electrode contacts the surface of the ingot at the position of 500° C., the temperature of the ingot decreases down to 400° C., while in case of ① and ② where the electrode contacts the surface of the ingot at positions of 900° C. and 800° C., the temperature of the ingot falls below 300° C., which is hardly different from the case of no energization.

Thus, although plasma heating is carried out, problems associated with the heating such as power loss and heating of solidified ingots are solved.

In case of 5 where the electrode contacts the surface of the ingot at a position at a temperature lower than 500° C., large Joule heat in the solidified ingots is produced above the contact position and a temperature drop is not sufficient, and therefore the temperature of the solidified ingot when it is extracted from the chamber does not decrease sufficiently. Furthermore, there is a large voltage drop, causing excessive power loss.

It goes without saying that combining the first silicon continuous casting method and the second silicon continuous casting method of the present invention will be more effective.

INDUSTRIAL APPLICABILITY

As explained above, the first silicon continuous casting method of the present invention relaxes and flattens the concave shape of the solid-liquid interface, which is a problem in induction heating. This flattening makes it possible to reduce the cooling section of the bottomless crucible, which enhances heat insulation of the side of solidified ingots immediately after solidification. Thereby, these features alleviate temperature gradient in the direction of the radius of solidified ingots immediately after solidification even in case of fast casting and improve the quality as a solar cell. Thus, this method allows high quality solidified ingots of silicon to be manufactured with a high degree of efficiency and at lower costs.

Furthermore, the second silicon continuous casting method of the present invention uses transferred plasma arc as the heating source to form silicon melt inside the bottomless crucible, thereby relaxes and flattens the concave shape of the solid-liquid interface which is a problem in induction heating. This flattening also makes it possible to reduce the cooling section of the bottomless crucible, which enhances heat insulation of the side of solidified ingots immediately after solidification. Even in case of fast casting, these features alleviate temperature gradient in the direction of the radius of solidified ingots immediately after solidification and improve the quality as a solar cell.

On top of it, allowing the plasma electrode to contact the surface of solidified ingots whose temperature falls within the range of 900 to 500° C. makes it possible to stably suppress Joule heating of solidified ingots, which presents a large problem for transferred plasma arc and prevent cracking of solidified ingots and abnormal wear of the cutting blade. This method also suppresses power loss of a plasma power supply involved in a considerable voltage drop and increases thermal efficiency.

Thus, the second silicon continuous casting method of the present invention as well as the first silicon continuous casting method allow high quality solidified ingots of silicon to be manufactured with a high degree of efficiency and at lower costs.

What is claimed is:

1. A silicon continuous casting method using at least plasma arc heating as a heating source for melting silicon raw materials, comprising:

allowing silicon melt formed inside a bottomless crucible by the heating source to descend and solidify; and continuously extracting solidified ingots of silicon from the bottomless crucible, wherein a plasma arc torch is moved for scanning along an inner surface of the crucible in a peripheral section whose distance from the inner surface of the crucible to a center of the torch represents 30% or less of the diameter of the crucible above the silicon melt inside the bottomless crucible in the horizontal direction.

2. The silicon continuous casting method according to claim 1, wherein the plasma arc is transferred plasma arc.

3. The silicon continuous casting method according to claim 1, wherein the bottomless crucible at least part in the axial direction of which is divided into a plurality of portions in the circumferential direction is placed inside an induction coil, and silicon melt is formed inside the bottomless crucible using electromagnetic induction heating by said induction coil and said plasma arc heating in combination.

4. The silicon continuous casting method according to claim 2, wherein characterized in that the bottomless crucible at least part in the axial direction of which is divided into a plurality of portions in the circumferential direction is placed inside an induction coil, and silicon melt is formed inside the bottomless crucible using electromagnetic induction heating by said induction coil and said plasma arc heating in combination.

5. The silicon continuous casting method according to claim 1, wherein the average scanning speed of the plasma arc torch is 50 to 300 cm/mm.

6. The silicon continuous casting method according to claim 2, wherein the average scanning speed of the plasma arc torch is 50 to 300 cm/mm.

7. The silicon continuous casting method according to claim 3, wherein the average scanning speed of the plasma arc torch is 50 to 300 cm/mm.

8. The silicon continuous casting method according to claim 4, wherein the average scanning speed of the plasma arc torch is 50 to 300 cm/mm.

9. The silicon continuous casting method according to claim 1, wherein the bottomless crucible is electrically insulated from a melting chamber that accommodates said bottomless crucible, positive, negative electrodes of the plasma arc torch and a heat insulation furnace installed under the bottomless crucible.

10. The silicon continuous casting method according to claim 2, wherein the bottomless crucible is electrically insulated from a melting chamber that accommodates said bottomless crucible, positive, negative electrodes of the plasma arc torch and a heat insulation furnace installed under the bottomless crucible.

11. The silicon continuous casting method according to claim 3, wherein the bottomless crucible is electrically insulated from a melting chamber that accommodates said bottomless crucible, positive, negative electrodes of the plasma arc torch and a heat insulation furnace installed under the bottomless crucible.

12. The silicon continuous casting method according to claim 4, wherein the bottomless crucible is electrically insulated from a melting chamber that accommodates said bottomless crucible, positive, negative electrodes of the plasma arc torch and a heat insulation furnace installed under the bottomless crucible.

13. The silicon continuous casting method according to claim 5, wherein the bottomless crucible is electrically insulated from a melting chamber that accommodates said bottomless crucible, positive, negative electrodes of the plasma arc torch and a heat insulation furnace installed under the bottomless crucible.

14. The silicon continuous casting method according to claim 6, wherein the bottomless crucible is electrically insulated from a melting chamber that accommodates said bottomless crucible, positive, negative electrodes of the plasma arc torch and a heat insulation furnace installed under the bottomless crucible.

15. The silicon continuous casting method according to claim 7, wherein the bottomless crucible is electrically insulated from a melting chamber that accommodates said bottomless crucible, positive, negative electrodes of the plasma arc torch and a heat insulation furnace installed under the bottomless crucible.

16. The silicon continuous casting method according to claim 8, wherein the bottomless crucible is electrically insulated from a melting chamber that accommodates said bottomless crucible, positive, negative electrodes of the plasma arc torch and a heat insulation furnace installed under the bottomless crucible.

17. A silicon continuous casting method using at least transferred plasma arc as a heating source for melting silicon raw materials, comprising:

allowing silicon melt formed inside a bottomless crucible by this heating source to descend and solidify; and thereby continuously extracting solidified ingots of silicon from the bottomless crucible, wherein a plasma electrode on the solidified ingot side to generate transferred plasma arc is allowed to contact the surface of the solidified ingot at positions where the temperature of the solidified ingot becomes 500° C. to 900° C.

18. The silicon continuous casting method according to claim 17, wherein the bottomless crucible at least part in the axial direction of which is divided into a plurality of portions in the circumferential direction is placed inside an induction coil, and silicon melt is formed inside the bottomless crucible using electromagnetic induction heating by said induction coil and plasma heating by said transferred plasma arc in combination.

19. The silicon continuous casting method according to claim 17, wherein the plasma electrode is made of a metal and is so configured as to elastically contacts the surface of the solidified ingot by means of elastic force of said metal.

20. The silicon continuous casting method according to claim 18, wherein the plasma electrode is an electrically conductive roller.

* * * * *